United States Patent [19]
Lee

[11] Patent Number: 5,831,880
[45] Date of Patent: Nov. 3, 1998

[54] METHOD FOR PROCESSING A SIGNAL IN A CSD FILTER AND A CIRCUIT THEREFOR

[75] Inventor: Myeong-hwan Lee, Suwon, Rep. of Korea

[73] Assignee: Samsung Electronics Co., Ltd., Kyungki-Do, Rep. of Korea

[21] Appl. No.: 716,891

[22] Filed: Sep. 20, 1996

[30] Foreign Application Priority Data

Sep. 30, 1995 [KR] Rep. of Korea ........................ 95-33999

[51] Int. Cl.$^6$ ........................ G06F 17/10; H04N 5/213
[52] U.S. Cl. .................. 364/724.16; 364/724.011; 364/724.19; 348/614; 370/290; 370/291
[58] Field of Search ................... 364/724.011, 724.012, 364/724.03, 724.05, 724.16, 724.17, 724.18, 724.19, 724.2, 728.06, 759, 760.01; 348/607, 611, 614; 370/268, 286, 290, 291

[56] References Cited

U.S. PATENT DOCUMENTS

| | | | |
|---|---|---|---|
| 4,953,026 | 8/1990 | Kobayashi et al. | 348/614 |
| 4,967,388 | 10/1990 | Tate | 364/760.1 |
| 5,014,263 | 5/1991 | Vairavan et al. | 370/290 |
| 5,058,047 | 10/1991 | Chung | 364/724.19 |
| 5,479,363 | 12/1995 | Wilson, Jr. et al. | 364/724.16 |
| 5,590,065 | 12/1996 | Lin | 364/724.1 |

OTHER PUBLICATIONS

"FIR Filter design over a Discrete Powers-of-Two Coefficients Space" by Y.C. Lim and B.R. Parker, IEEE Trans. Acoust., Speech and Signal Processing, vol. ASSP-31, pp. 583-591, Jun. 1983.

"A Simple Design of FIR Filters with Powers-of-Two Coefficients" by Q. Zhao and Y. Tadokoro, IEEE Trans. on Circuit and Systems, vol. 35, No. 5, pp. 566-570, May 1988.

"An Improved Search Algorithm for the Design of Multiplierless FIR Filters with Powers-of-Two Coefficients" by Henry Samueli, IEEE Trans., on Circuit and Systems, vol. 36, No. 7, pp. 1044-1047, Jul. 1989.

*Primary Examiner*—Emmanuel L. Moise
*Attorney, Agent, or Firm*—Sughrue, Mion, Zinn, Macpeak & Seas, PLLC

[57] ABSTRACT

A method for processing a signal in a CSD filter includes the steps of obtaining real coefficients optimized to desired filter characteristics, calculating scaling factors for each real coefficient which minimizes errors between the real coefficients and converted CSD codes, producing optimum CSD coefficients by using the calculated scaling factors, and filtering input data by using the optimum CSD coefficients. In the method of the present invention, conversion of the real coefficients into the CSD coefficients is performed in the time domain, thereby improving operating speed and increasing bit resolution with the number of non-zero digits fixed, as compared to conversion in the frequency domain. As a result, the present invention can be applied to an adaptive filter and a polyphase filter.

29 Claims, 7 Drawing Sheets

METHOD FOR PROCESSING A SIGNAL IN A CSD FILTER AND A CIRCUIT THEREFOR

BACKGROUND OF THE INVENTION

1. Field of the Invention

The present invention relates to a method for processing a signal in a filter employing a Canonic Signed Digit (CSD) code and a circuit suitable for the method. More particularly, it relates to a method for processing a signal in a CSD filter, which can improve the performance of the filter and can be adapted to many kinds of filters by increasing the resolution of scaling factors, and to a circuit suitable for the method.

2. Description of the Related Art

A digital filter is the most important and the most frequently used element in processing a digital signal, and includes delays, multipliers and adders. The simplest form of a digital filter is a multiplier with no delay. This type of filter is generally used for processing a signal, such as in controlling gains.

The complexity of the digital filter mainly depends on its length, and then on bit resolution which is determined by the number of bits of an input signal, the coefficients of a multiplier (i.e. filter coefficients), and the number of bits in an adder.

The digital filter is generally comprised of a plurality of multipliers. The multipliers, which occupy large areas and consume much power, impose constraints on a one-chip solution when circuits are integrated. In fact, in digital signal processing applications, a digital filter which is shorter than is needed has recently been used with respect to a one-chip solution when multiple functions are implemented using the filters. An example of such an application is an interpolation filter which relies on the bilinear characteristics of a fixed coefficient.

In this aspect, efforts have been expended to reduce the associated hardware complexity by simplifying multipliers used in such digital filters. An example of such an effort which has been explored is a multiplier in which a CSD code is employed.

To obtain a filter employing a CSD code, all the real coefficients of the designed filter must be converted into CSD coefficients. However, when the conversion is performed simply by quantization, the performance of the filter is greatly degraded. Thus, many optimization techniques have been suggested, such as in (1) "FIR Filter Design Over A Discrete Powers-of-Two Coefficients Space" by Y. C. Lim and B. R. Parker, IEEE Trans. on Acoust., Speech and Signal Processing, vol. ASSP-31, pp. 583–591, June 1983; (2) "A Simple Design of FIR Filters with Powers-of-Two Coefficients" by Q. Zhao and Y. Tadokoro, IEEE Trans. on Circuits and Systems, vol. 35, no. 5, pp. 566–570, May 1988; and (3) "An Improved Search Algorithm for the Design of Multiplierless FIR Filters with Powers-of-Two Coefficients" by Henry Samueli, IEEE Trans., on Circuits and Systems, vol. 36, no. 7, pp. 1044–1047, July 1989.

In reference (1), optimum conversion is performed by obtaining optimized real coefficients, quantizing them, and using "a mixed integer linear programming algorithm".

In reference (2), to overcome the problems involved with the optimization technique of reference (1) of the calculation time being too long and the limitation on the length of a convertible filter of approximately 40 taps, a quasi-optimum algorithm is suggested for simultaneously utilizing the time domain and the frequency domain to thereby perform an optimum conversion.

In reference (3), the algorithm of reference (2) is improved by using an optimum scaling factor and a local bivariate search algorithm, and the number L of non-zero digits is increased to compensate for quantization errors produced during conversion of the real coefficients into initial CSD coefficients. As suggested in reference (3), when a filter coefficient is 0.5 or above, additional allocation of non-zero digits basically increases the number of bits which makes hardware for an adaptive filter or a polyphase filter so complicated that the hardware cannot be used, even though it may be useful for a fixed-type filter.

The optimization algorithms described in the above references require many calculations and cannot be applied to an adaptive filter or a polyphase filter, since the conversions are based on ripples in a frequency domain pass-band and stop-band.

Moreover, the algorithms are difficult to apply to a filter in which coefficient conversion based on the ripple in the frequency domain is not easy to perform. For example, the algorithms cannot be applied to an equalizing filter for removing a "ghost" or, in other words, a ghost-removing filter. Therefore, for these filters, real coefficients are converted into CSD coefficients based on the amount of remaining "ghost".

In addition, with the optimization techniques suggested in the above references, the limitation of a CSD code having non-uniform characteristics cannot be overcome, since assigning a single scaling factor to all filter coefficients is inefficient and lowers the performance of a filter.

SUMMARY OF THE INVENTION

The present invention is intended to circumvent the above problems. It is an object of the present invention to provide a method for processing a signal in a CSD filter, in which real coefficients are directly converted into filter coefficients expressed as CSD codes in the time domain without performing an optimized conversion in the frequency domain.

It is another object of the present invention to provide a method for processing a signal in a CSD filter, in which the number of scaling factors are adjusted to increase the resolution of the scale factors without increasing a predetermined number of nonzero digits, and which can be adapted to many kinds of filters.

It is still another object of the present invention to provide a method for processing a signal in a CSD filter, in which real coefficients are converted into CSD coefficients by grouped scaling factors obtained by partial optimization of the real coefficients.

It is yet another object of the present invention to provide a method for processing a signal in a CSD filter, in which CSD coefficients, converted by a plurality of scaling factors, are processed by a plurality of inverse-scaling factors corresponding to the plurality of scaling factors, respectively.

It is a further object of the present invention to provide a CSD filter circuit suitable for the above methods for processing a signal in a CSD filter.

To achieve the above objects, there is provided a method for processing a signal in a canonic signed digit (CSD) filter having desired filter characteristics obtained based on filter coefficients expressed in CSD codes called CSD coefficients, the method comprising the steps of:

(a) obtaining real coefficients optimized to the desired filter characteristics;

(b) calculating scaling factors for the real coefficients which minimize an error during a conversion of the real coefficients into CSD coefficients;

(c) converting said real coefficients into optimum CSD coefficients by using said scaling factors; and (d) filtering input data by using said optimum CSD coefficients. There is also provided an N-tap canonic signed digit (CSD) filter circuit having real filter coefficients expressed in CSD codes producing desired filter characteristics, comprising:

N−1 unit delays connected in series for delaying input data;

a CSD coefficient generator for calculating scaling factors for the real coefficients which minimize an error between the real coefficients and CSD coefficients obtained by multiplying said real coefficients obtained according to said filter characteristics by a predetermined gain, and generating optimum CSD coefficients by using said calculated scaling factors;

N CSD multipliers for multiplying outputs of said N−1 unit delays by said optimum CSD coefficients;

N inverse scalers for scaling outputs of said N CSD multipliers with inverse-scaling factors which are the reciprocals of said scaling factors calculated for the real coefficients by said CSD coefficient generator; and an adder for adding outputs of said N inverse scalers and producing a final filter output.

BRIEF DESCRIPTION OF THE DRAWING

The above objects and advantages of the present invention will become more apparent by describing in detail preferred embodiments thereof with reference to the attached drawings in which.

DETAILED DESCRIPTION OF THE PREFERRED EMBODIMENT

Preferred embodiments of a method for processing a signal in a CSD filter and a circuit suitable for performing the method, according to the present invention, are described below.

Figure 1:
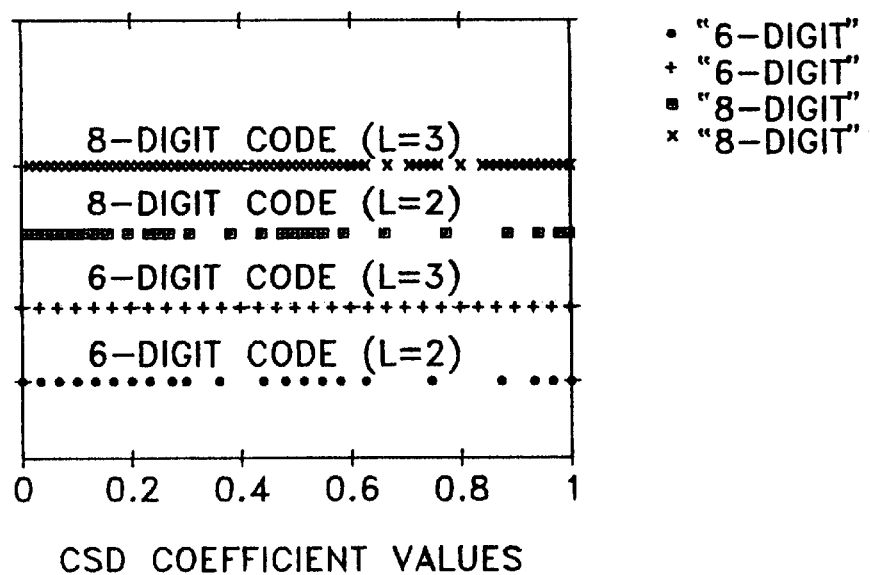
FIG. 1 illustrates distributions of CSD coefficients.

Referring to FIG. 1, a CSD code has the following general characteristics.

A CSD code X has values of "−1" or "1" assigned to a fixed number of digits, and has a value of "0" assigned to the remaining digits. This CSD code X is expressed as $$X = \sum_{k=1}^{L} S_k 2^{-P_k} \quad (1)$$

where a coefficient, having a kth digit value, $S_k \in \{-1, 0, 1\}$, and $P_k \in \{0, 1, \ldots, M\}$, where M indicates the total number of digits, and L indicates the number of digits which do not have a value of "0" (hereinafter, referred to as non-zero digits). That is, the number of digits having a value "−1" or "1", namely, a non-zero value, is smaller than or equal to L.

For example, 127/128, which equals 0.9921875, is expressed in a general binary code as "0.1111111", having seven non-zero digits. When this value is represented in a CSD code, with "L=2", the value is represented as "1.0000001", where $\underline{1}$ indicates "−1".

An advantage of the CSD code over a general radix-2 binary code is that it can express a value with fewer non-zero digits due to the flexibility derived from using negative digits.

In a filter employing filter coefficients expressed in CSD codes (hereinafter, referred to as "CSD coefficients"), the number of addition/subtraction operations needed for a multiplication operation can be reduced by limiting L. That is, in the filter using CSD coefficients, since the coefficients have values of "−1" or "1" represented by a fixed number of digits, a CSD multiplier can be configured with as many as L shifters and as many as L−1 adders/subtractors. Therefore, the number of adders/subtractors needed for each multiplier in the filter can be one smaller than L. As a result, the amount of hardware required for the digital filter can be reduced.

FIG. 1 illustrates distributions of CSD coefficients set for 6- and 8-digit codes with 2 and 3 non-zero digits, where •(6-digit) represents the case in which L=2 and M=6, +(6-digit) represents the case in which L=3 and M=6, □(8-digit) represents the case in which L=2 and M=8, and ×(8-digit) represents the case in which L=3 and M=8. As shown in FIG. 1, the distributions of the CSD coefficients are not uniform and the CSD coefficients are concentrated in an area in which the CSD coefficients have small values. The smaller M and L are, the less uniform the distribution of CSD coefficients is. However, since the frequency of calculations is increased in a filter with larger values of M and L, a CSD coefficient conversion which is effective and which makes M and L smaller, is required.

In a CSD filter having these characteristics, a real-numbered real filter coefficient (hereinafter, referred to as a "real coefficient") is not directly converted into a CSD coefficient. Instead, the real coefficient is multiplied by a scaling factor which is a kind of gain adjusting the magnitude of the real coefficient, and then converted into the CSD coefficient. In this way, a real coefficient having a relatively large value in an area of a relatively low distribution density of CSD coefficients is converted into a CSD coefficient having a relatively small value in an area having a relatively high distribution density of CSD coefficients when the scaling factor is smaller than 1. However, the scaling factor is not restricted to be always smaller than 1.

The premise for using a scaling factor is that despite assignment of a predetermined gain to a converted coefficient and a real coefficient, both the coefficients have the same normalized-frequency characteristics. That is, the real coefficient can be converted into the CSD coefficient by using the scaling factor, because a filter gain has no influence on the frequency characteristics of the filter.

However, the gain of the filter may be increased or decreased when the real coefficient is converted into the CSD coefficient by the scaling factor. This problem of gain change can be reduced by multiplying the CSD coefficient by an inverse-scaling factor which is the reciprocal of the scaling factor. Quantization errors (hereinafter, referred to as "conversion errors") produced during the conversion of the real coefficient into the CSD coefficient can be reduced by using an optimum scaling factor and inverse-scaling factor.

Figure 2:
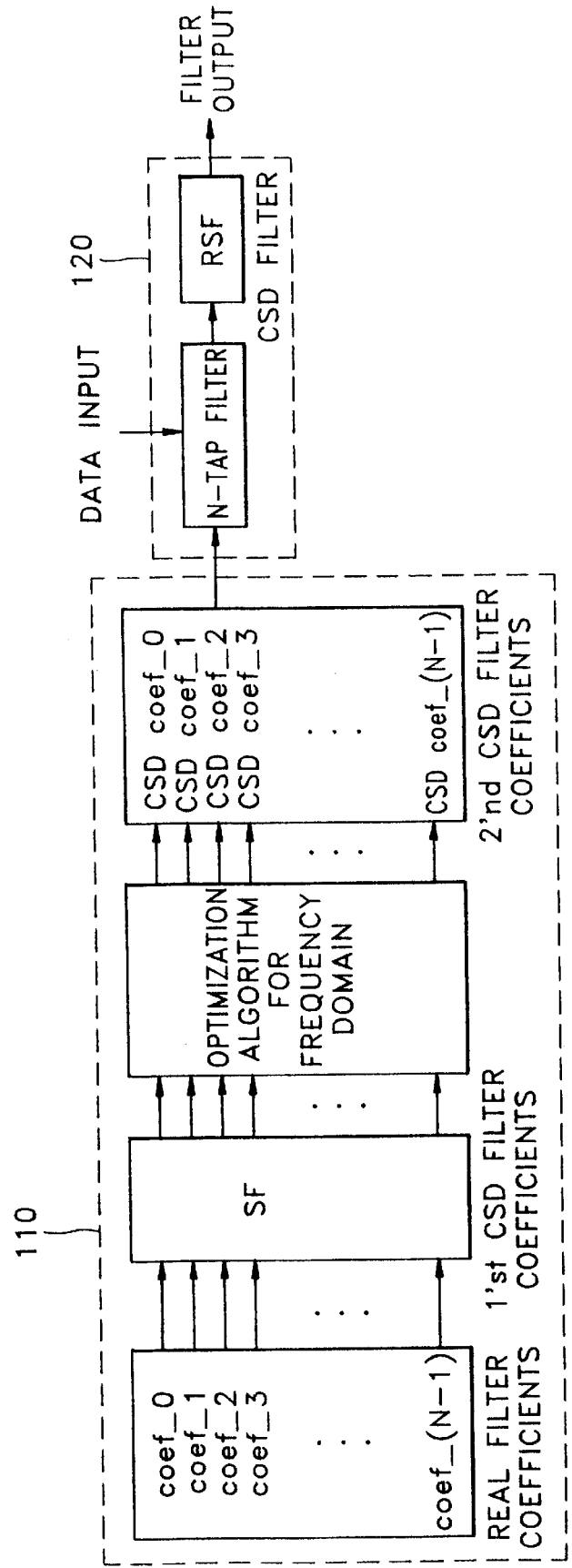
FIG. 2 is a conceptual view for explaining a conventional method of processing a signal in a CSD filter.
Figure 3:
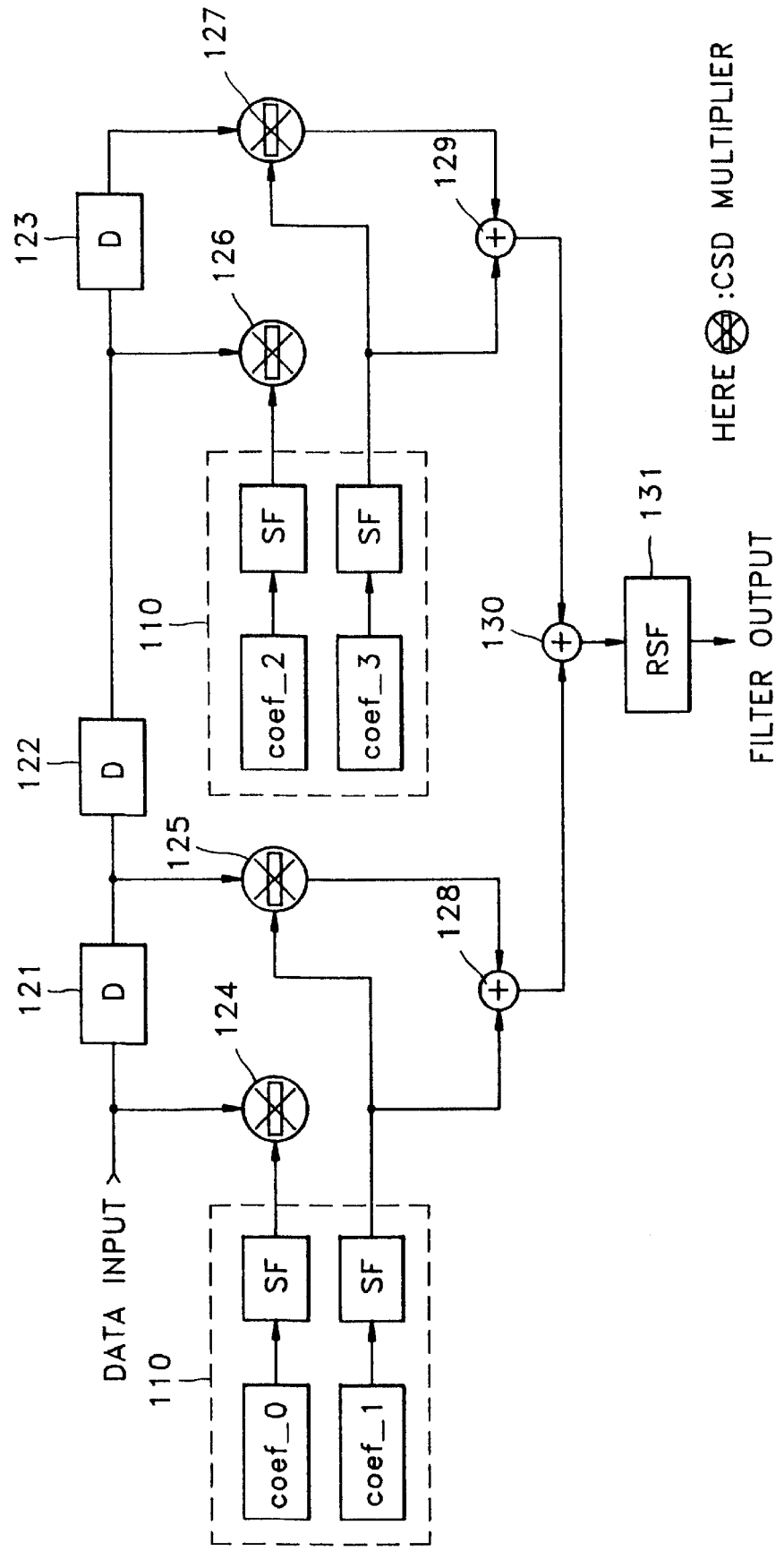
FIG. 3 is a circuit diagram of a CSD filter for implementing the method shown in FIG. 2.

Referring to FIGS. 2 and 3, a conventional method for utilizing a scaling factor and a circuit therefor will be described.

In general, the output y(n) of an N-tap filter with respect to an input signal x(n) is given by $$y(n) = \sum_{k=0}^{N-1} x(n-k)h(k) \quad (2)$$

A scaling factor A in the conventional method is chosen so as to minimize an error, which is given by equations (3) and (4) shown below, between a real coefficient h(n) and its most approximate CSD code $\bar{h}(n)$ multiplied by an inverse scaling factor 1/A.

$$E(A) = \sum_{k=0}^{N-1} (h(n) - \bar{h}(n)/A)^2 \quad (3)$$

$$\bar{h}(n) = [A \cdot h(n)] \quad (4)$$

where [ ] implies a CSD conversion in which real coefficient h(n) is simply quantized into the most approximate one of the given CSD codes.

As described above, a scaling factor is widely used in CSD applications, since conversion errors resulting from non-uniform characteristics of a CSD code are decreased by applying a gain of the scaling factor, under the premise that frequency characteristics undergo no change in spite of the addition, by the scaling factor, of the gain of the filter.

FIG. 2 is a conceptual view of a conventional method for processing a signal in a filter by using a scaling factor according to equations (3) and (4).

In FIG. 2, the bCSD 110 represents operations performed in a CSD coefficient generator. If a CSD filter's coefficients are fixed, a general-purpose microprocessor, or a controller having a sufficient calculation capability, is used for performing the calculations. A CSD filter 120 is constructed based on the CSD multipliers, adders and so on.

The signal processing method shown in FIG. 2 is described below as STEP 1–STEP 6.

STEP 1: N optimum real coefficients (coef_0-coef_(N-1)) are obtained using a filter design algorithm (or tool) according to the corresponding filter function, e.g., high-pass filtering or low-pass filtering.

STEP 2: a single scaling factor is calculated using equations (3) and (4) for a predetermined L, and the N real coefficients are converted into the most approximate corresponding CSD coefficients (i.e., the first CSD coefficients) by use of the single scaling factor.

STEP 3: a frequency domain optimization algorithm is used which is based on the amount of ripple present.

STEP 4: optimized CSD coefficients, that is the second CSD coefficients: CSD coef_0-CSD coef_(N-1), are produced from the first CSD coefficients by the optimization algorithm.

STEP 5: the optimized CSD coefficients are multiplied by input data in a CSD multiplier (this operation is referred to as "CSD multiplication").

STEP 6: a final filter output is produced by operating on the result of the multiplication in STEP 5 with a single inverse-scaling factor, which is the reciprocal of the scaling factor (RSF) used earlier.

The optimization algorithm used in the method shown in FIG. 2 has the disadvantage of requiring the above described calculations and a long calculation time, since the frequency ripple is used as a variable.

Further, the above method is difficult to use when an optimization method for the frequency domain is not available, as in an adaptive filter and a polyphase filter, or when conversion characteristics are not determined on the basis of the amount of ripple, as in a ghost-removing filter and a equalizing filter for removing a ghost.

FIG. 3 is a circuit diagram of a 4-tap CSD filter for implementing the method shown in FIG. 2.

In FIG. 3, the 4-tap CSD filter is comprised of three unit delays 121–123 connected in series for delaying input data, a first CSD multiplier 124 for multiplying a CSD coefficient coef_0 by the input data, a second CSD multiplier 125 for multiplying the output of first unit delay 121 by a CSD coefficient coef_1, a third CSD multiplier 126 for multiplying the output of second unit delay 122 by a CSD coefficient coef_2, a fourth CSD multiplier 127 for multiplying the output of third unit delay 123 by a CSD coefficient coef_3, a first adder 128 for adding the outputs of first and second CSD multipliers 124 and 125, a second adder 129 for adding the outputs of third and fourth CSD multipliers 126 and 127, a third adder 130 for adding the outputs of first and second adders 128 and 129, and an inverse scaler 131 for scaling the output of third adder 130 with a single inverse-scaling factor, or reciprocal scaling factor (RSF).

In FIG. 3, the CSD coefficient generator 110 is drawn divided into two parts for the sake of simplicity. As described with reference to FIG. 2, the CSD coefficients coef_0 through coef_3 output from CSD coefficient generator 110 are second CSD coefficients obtained by converting the real coefficients into their corresponding most approximate CSD coefficients by the scaling factor and optimizing them in the frequency domain. The inverse-scaling factor is the reciprocal of the scaling factor.

The 4-tap CSD filter circuit according to the conventional method shown in FIG. 3 has the problems that it takes much time to convert a real coefficient into a CSD coefficient in CSD coefficient generator 110 and conversion performance is not so good due to initial conversion errors related to the scaling factor choice.

Therefore, to overcome the problems of the conventional CSD filter conversion method, the present invention provides a conversion method sufficiently effective, in which the conversion is performed only in the time domain with respect to a predetermined number of non-zero digits, by using a plurality of scaling factors and a plurality of inverse-scaling factors in accordance with characteristics of CSD coefficients. This method effectively removes or disperses conversion errors resulting from non-uniform characteristics from the plurality of scaling factors, thus making signal processing by CSD coefficients more useful. In addition, scaling factor processing itself is used for the conversion optimization, whilst scaling factor processing serves as pre-filtering for a conversion optimization in the frequency domain in a conventional CSD filter. Therefore, the step of conversion optimization is not required in the present invention, and accordingly the calculation time is reduced.

A method for converting a real coefficient into a CSD coefficient by controlling a scaling factor in the time domain, according to the present invention, is described below.

A real coefficient must be converted into its approximate corresponding CSD coefficient in a filter designed to have certain desired characteristics.

For this purpose, equations (3) and (4) are modified resulting in equations (5) and (6), so that a scaling factor is assigned to each filter coefficient (real coefficient).

Theoretically, h(n) can be exactly equal to $\bar{h}(n)$, even in the case of L=1, when separate scaling factors and inverse-scaling factors are assigned to each filter coefficient.

Therefore, a CSD coefficient conversion having improved conversion performance without increasing L, is possible by assigning at least one scaling factor/inverse-scaling factor to each filter coefficient, that is, increasing the resolution of scaling factors.

$$E(A) = \sum_{k=0}^{N-1} (h(n) - \bar{h}(n)/A_n)^2 \quad (5)$$

$$\bar{h}(n) = [A_n \cdot h(n)] \quad (6)$$

Here, the scaling factors assigned to each real coefficient h(n) are chosen such that the squared error sum between real coefficients h(n) and their most approximate corresponding CSD codes obtained by equation (5) is a minimum value. With increase in the resolution of the scaling factors, the value of E(A) becomes much smaller than in the conventional method. This present method obviates the need for optimization in the frequency domain, thus remarkably reducing the burden of performing the calculation burden related to calculation times.

If $A_0 = A_1 =, \ldots, = A_{N-2} = A_{N-1} = A$ in equations (5) and (6), equations (5) and (6) produce the same result as that of equations (3) and (4).

Equations (5) and (6) can be modified as follows, to minimize an error for each coefficient.

$$E(A_n) = (h(n) - \bar{h}(n)/A_n)^2 \quad (7)$$

$$\bar{h}(n) = [A_n \cdot h(n)]$$

where $n = 0, 1, 2, \ldots, N-1$.

If scaling factors are chosen as to minimize $E(A_k)$ in equation (7) for each coefficient, respectively, a perfect conversion of a real coefficient into a CSD coefficient is possible. That is, $$\sum_{k=1}^{N-1} E(A_n) \cong 0 \quad (8)$$

In practice, it is likely that scaling factors and inverse-scaling factors are not real numbers, but take the form of a power-of-two or of a CSD. Nevertheless, approximate values are obtained according to equation (8).

In the conventional method, the scaling factors of all coefficients have the same value, that is, $$SF\_1 = SF\_2 =, \ldots, = SF\_n = SF(=A).$$

Figure 4:
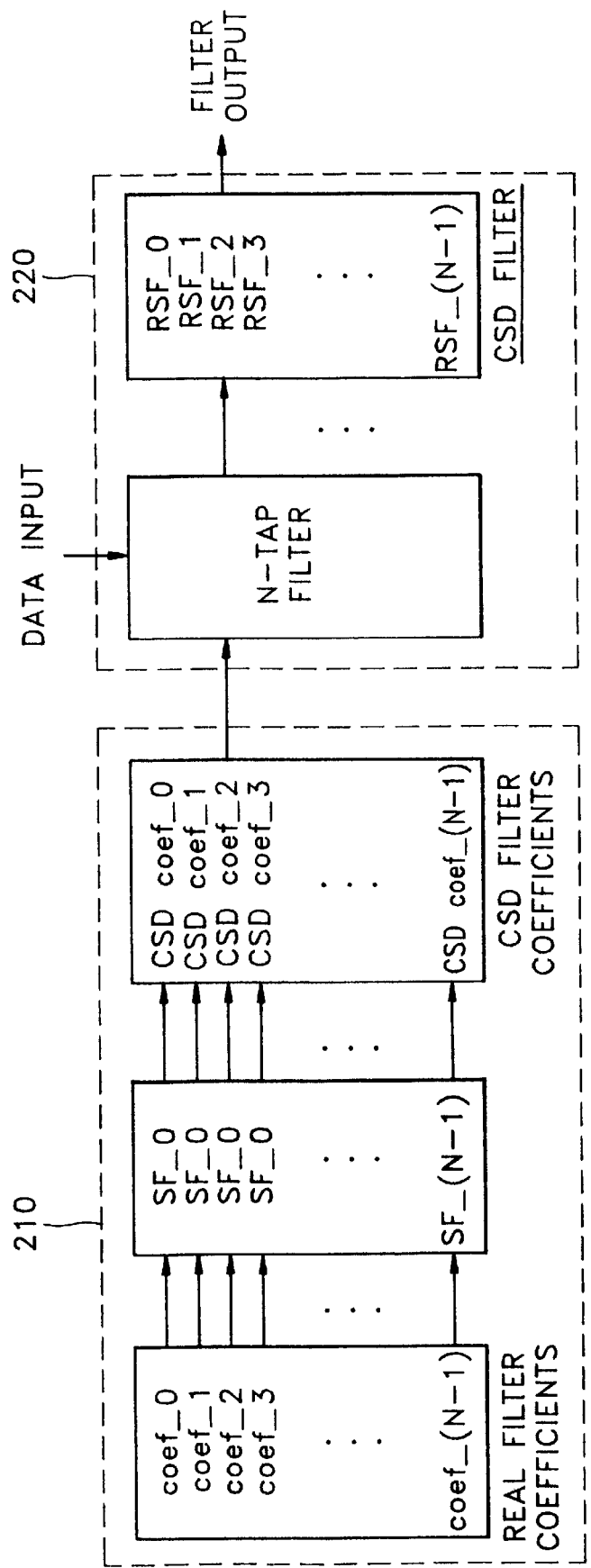
FIG. 4 is a conceptual view for explaining a method of processing a signal in a CSD filter according to an embodiment of the present invention.

A method for processing a signal in a CSD filter according to the present invention is conceptually illustrated in FIG. 4.

In FIG. 4, the block 210 represents operations performed in a CSD coefficient generator. A general-purpose microprocessor or a controller having a sufficient calculation capability can be used to perform the calculations. A CSD filter 220 is constructed based on CSD multipliers, adders, and so on.

The signal processing method shown in FIG. 4 is described below as STEP 11–STEP 15.

STEP 11: N optimum real coefficients (coef_0coef_(N–1)) are obtained using a filter design tool according the corresponding desired filter function.

STEP 12: scaling factors (SF_0–SF_(N–1)) corresponding to the respective real coefficients are calculated using equations (6) and (7), for a predetermined number L of non-zero digits.

STEP 13: using the calculated scaling factors, the real coefficients are converted into their most approximate corresponding CSD codes, which are optimum CSD coefficients (CSD coef_0-CSD coef_(N–1)).

STEP 14: input data are CSD-multiplied by the converted optimum CSD coefficients in an N-tap filter.

STEP 15: the results of the multiplication of STEP 14 are scaled with N inverse-scaling factors (RSF_0–RSF_(N–1)), which are reciprocals of the scaling factors obtained in STEP 12, to produce a final filter output.

Therefore, the method shown in FIG. 4 for obtaining CSD coefficients obviates the need for optimization in the frequency domain which the conventional method requires. Thus, the calculation burdens and calculation time can be remarkably reduced.

The present invention can reduce initial conversion errors due to incorrect scaling factors employing a local search algorithm used in the above-mentioned reference (2). Since the present invention improves calculation speed and conversion performance, it can be applied to a polyphase filter and an adaptive filter employing variable filter coefficients as well as a fixed type filter using fixed filter coefficients.

Figure 5:
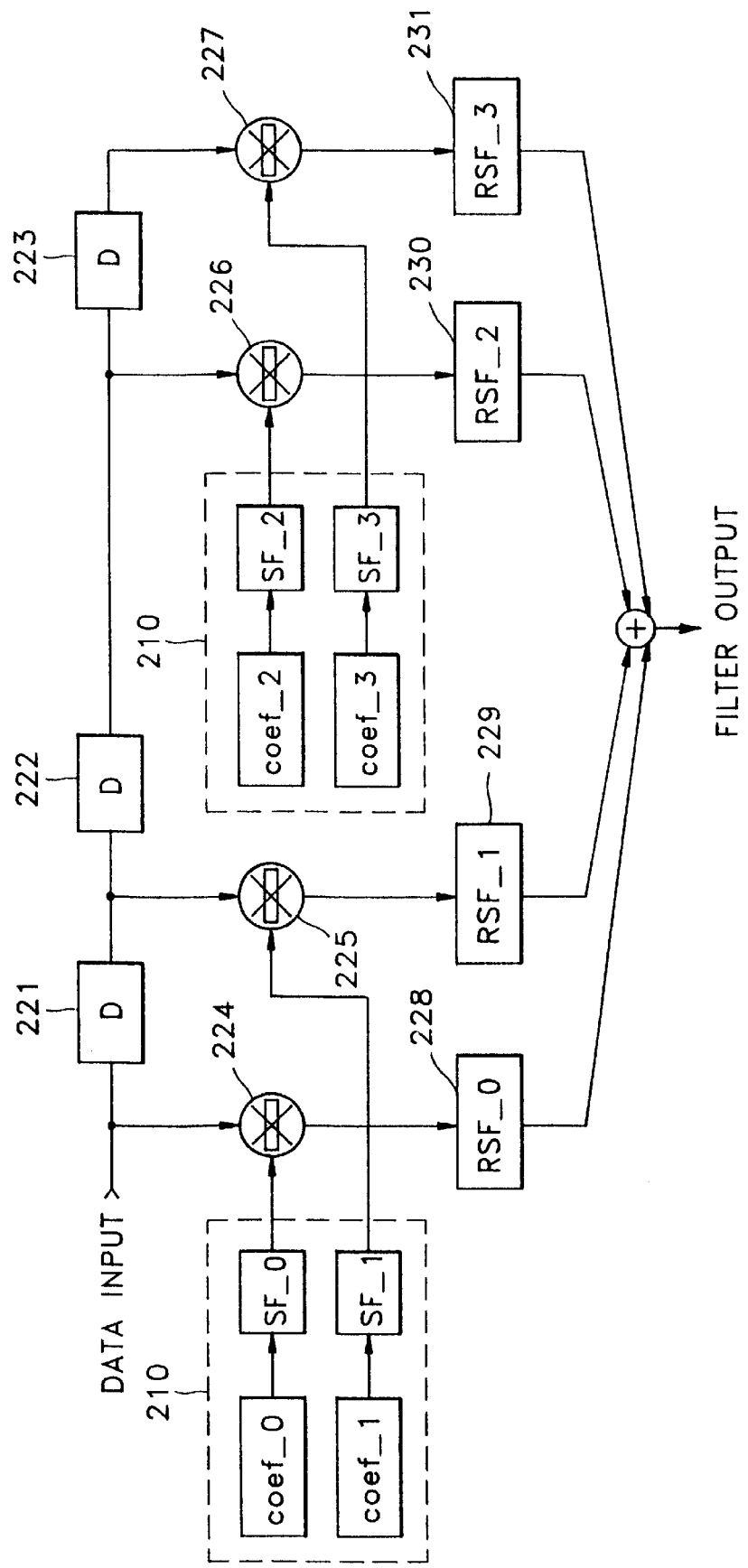
FIG. 5 is a circuit diagram of a CSD filter for implementing the method shown in FIG. 4.

FIG. 5 is a circuit diagram of a 4-tap CSD filter implementing the method shown in FIG. 4.

In FIG. 5, the 4-tap CSD filter is comprised of three unit delays connected in series 221–223 for delaying input data, a first CSD multiplier 224 for multiplying a CSD coefficient coef_0 by the input data, a CSD multiplier 225 for multiplying the output of first unit delay 221 by a CSD coefficient coef_1, a third CSD multiplier 226 for multiplying the output of second unit delay 222 by a CSD coefficient coef_2, a fourth CSD multiplier 227 for multiplying the output of third unit delay 223 by a CSD coefficient coef_3, first through fourth inverse scalers 228–231 for scaling the outputs of first through fourth multipliers 224–227 by the first through fourth inverse scaling factors (RSF_0–RSF_3), and an adder 232 for adding the outputs of first through fourth inverse scalers 228–231 to produce a final filter output.

Here, as described with reference to FIG. 4, the CSD coefficients coef_0 through coef_3 output from CSD coefficient generator 210 are those obtained by converting the real coefficients produced according to the particular desired filter characteristics, by means of the first through fourth scaling factors calculated from equations (6) and (7).

Further, inverse scalers 228–231 may be comprised of shifters for shifting the outputs of multipliers 224–227 according to inverse-scaling factors, or CSD multipliers for multiplying the outputs of multipliers 224–227 by the inverse-scaling factors.

Here, when both the scaling factor and the inverse scaling factor are expressed by powers of 2 the calculation of the inverse scaling factors can be performed by shifters and there is no need for additional hardware for the calculation of the inverse-scaling factors. Both the scaling factor and the inverse scaling factor are expressed by $2_{-SF}$.

Figure 6:
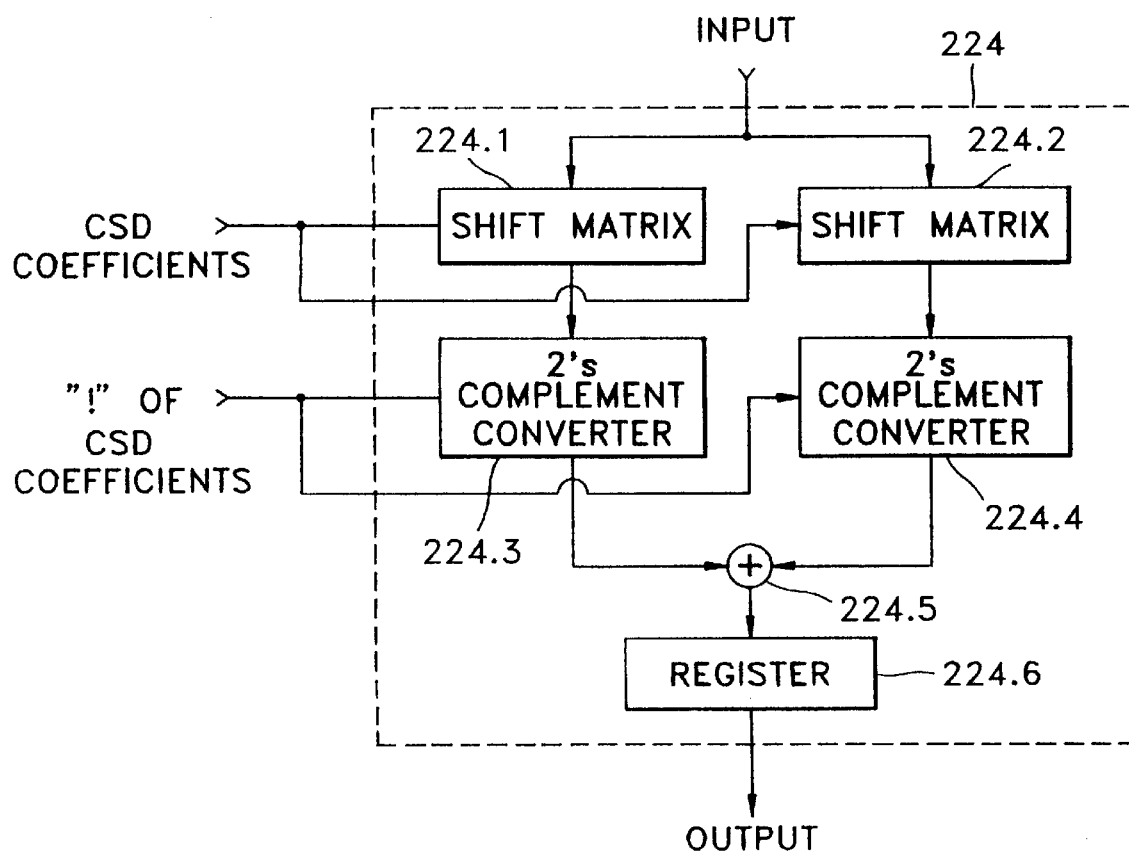
FIG. 6 is a detailed diagram of a CSD multiplier shown in FIG. 5.

A CSD multiplier can be comprised of as many as L shifters and as many as L-1 adders/subtractors, as shown in FIG. 6, which shows first multiplier 224, where L=2.

Referring to FIG. 6, CSD multiplier 224 is comprised of two shift matrices 224.1 and 224.2 which receive input data, shift the input data according to the value of a CSD coefficient, and output the result. The CSD multiplier 224 also includes two 2's complement converters 224.3 and 224.4 which convert the outputs of shift matrices 224.1 and 224.2 into 2's complements values, when a "1" is present in a CSD coefficient input from CSD coefficient generator 220. The CSD multiplier 224 further includes an adder 224.5 for adding the outputs of 2's complement converters 224.3 and 224.4. Here, a register 224.6 may be additionally incorporated with adder 224.5 for operation in a high-speed mode. Further, if the CSD filter is an adaptive type filter, the shift matrices may be replaced by barrel shifters. If it is a fixed type filter, the shift matrices may be replaced by a simple wiring arrangement which manipulates the shifting operation between an input and a 2's complement converter. The 2's complement converter can be comprised of an inverter and an adder. Also, adder 224.5 and carry inputs of adders between taps can be used for performing addition.

Operation of the CSD multiplier shown in FIG. 6 is described as follows. Shift matrices 224.1 and 224.2 shift stored data according to the value of a CSD coefficient generated from CSD coefficient generator 210. 2's complement converters 224.3 and 224.4 convert the outputs of shift matrix 224.1 and 224.2 into 2's complements values, when a "1" is present in the CSD coefficient, whilst they do not respond to values of "1" or "0" in the CSD coefficient. Adder 224.5 adds the outputs of 2's complement converters 224.3 and 224.4.

However, when a different scaling factor and an inverse-scaling factor are assigned to each of the real coefficients as described above, the amount of hardware is increased even though calculations are performed fast and conversion performance is improved. Therefore, it is necessary to limit the scaling factor's resolution considering the amount of hardware to be employed in a practical application.

As an alternative, the calculation of the inverse-scaling factors may be performed by shifters only when the scaling factors and the inverse-scaling factors are expressed by powers of 2. In this case, however, the available scaling factors and inverse-scaling factors are restricted somewhat. As another alternative, the scaling factors for respective filter coefficients may need to be grouped according to their proximity.

In another embodiment of the present invention, scaling factors are grouped into fewer numbers by categorizing them according to the position of filter coefficients or according to the similarities in their size, in order to limit their resolution.

That is, in the former case, the same scaling factors are assigned to real coefficients in every predetermined number of digits or to real coefficients of taps having the same phase. This can be usefully applied to a polyphase filter. In the latter case, a combination of scaling factors which minimizes E(A) is chosen from among combinations of scaling factors in which similar scaling factors are grouped together to form the same scaling factor.

For example, assume a polyphase filter which has nine taps, and let the coefficients of the filter be C1, C2, ..., C9. According to the first grouping method, every three coefficients can be grouped, e.g., to form groups [C1, C2, C3], [C4, C5, C6] and [C7, C8, C9]. Otherwise, the coefficients of the taps having the same phase can be grouped together, e.g., to form groups [C1, C4, C7], [C2, C5, C8] and [C3, C6, C9]. Then, a different scaling factor is calculated for each of the groups. On the other hand, according to the second grouping method, a different scaling factor is calculated for each of the groups. Then, the scaling factors having similar sizes are unified to a single scaling factor while minimizing the squared error sum.

Figure 7:
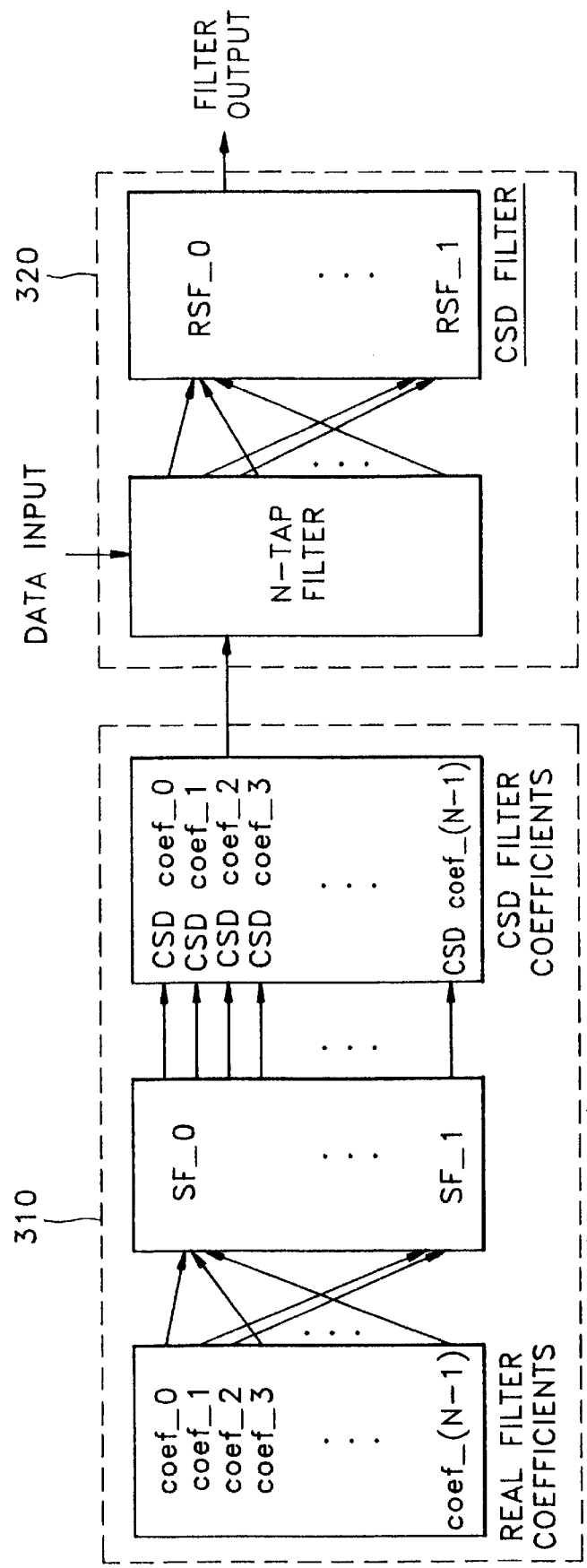
FIG. 7 is a conceptual view for explaining a method of processing a signal in a CSD filter according to another embodiment of the present invention.

FIG. 7 is a conceptual view of a method for processing a signal in a filter with two scaling factors, according to this other embodiment of the present invention.

Referring to FIG. 7, block 310 represents operations performed in a CSD coefficient generator. A general-purpose microprocessor or a controller having a sufficient calculation capability can be used to perform the calculations. A CSD filter 320 is constructed based on CSD multipliers, adders, and so on.

The signal processing method shown in FIG. 7 is described below as STEP 21 through STEP 25.

STEP 21: N real coefficients (coef_0-coef_(N−1)) are obtained using a filter design tool according to the desired characteristics of a corresponding filter.

STEP 22: a predetermined number (here, two) of scaling factors (SF_0 and SF_1) are calculated by assigning the same scaling factor to coefficients in a predetermined digit or grouping scaling factors for real coefficients in accordance with similarities between the values of the scaling factors, according to characteristics of CSD coefficients. The scaling factors are calculated by equations (5) and (6).

STEP 23: the real coefficients are converted into CSD codes according to the two scaling factors obtained based on the grouping described above. These CSD codes are optimum CSD coefficients (CSD coef_0-CSD coef_(N−1)).

STEP 24: the input data are CSD-multiplied by the optimized CSD coefficients, in the N-tap filter.

STEP 25: the results of the multiplication in STEP 24 are scaled according to two inverse-scaling factors (RSF_0 and RSF_1) which are reciprocals of the scaling factors obtained in STEP 22, respectively, to produce a final filter output.

The overall performance of a filter can be improved if scaling factors are grouped as shown in FIG. 7, for example, assigning a separate scaling factor to each filter group in a polyphase filter.

Conversion performance can be further improved if real coefficients are converted into first CSD coefficients by a plurality of scaling factors, and then optimized CSD coefficients are generated using an optimization algorithm based on ripple in the frequency domain, as in the conventional CSD filter.

Figure 8:
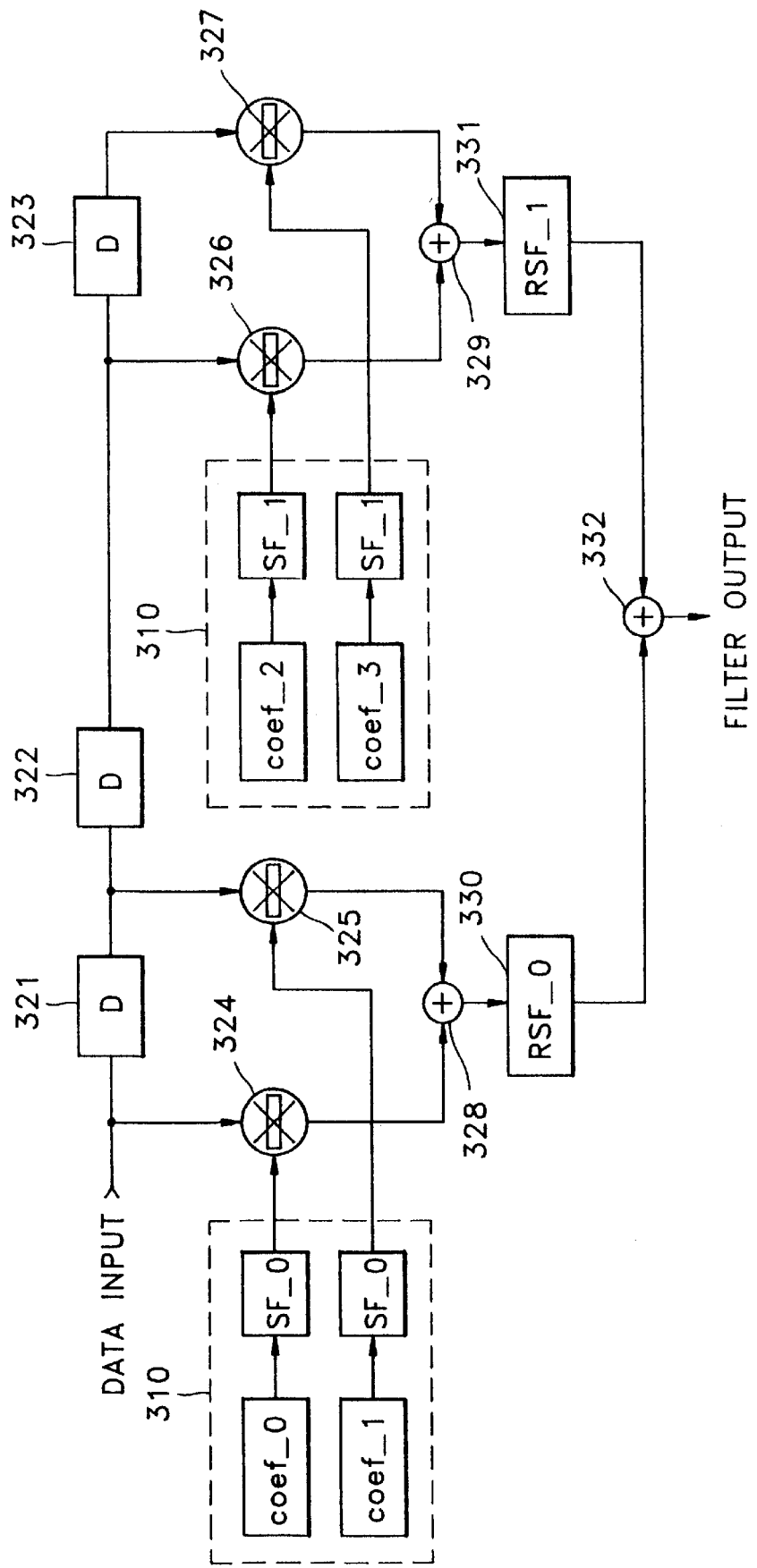
FIG. 8 is a circuit diagram of a CSD filter for implementing the method shown in FIG. 7.

FIG. 8 is a circuit diagram of a 4-tap CSD filter for implementing the method shown in FIG. 7.

In FIG. 8, the 4-tap CSD filter is comprised of three unit delays 321–323 connected in series for delaying input data, a first CSD multiplier 324 for multiplying a CSD coefficient coef_0 by the input data, a second CSD multiplier 325 for multiplying the output of first unit delay 321 by a CSD coefficient coef_1, a third CSD multiplier 326 for multiplying the output of second unit delay 322 a CSD coefficient coef_2, a fourth CSD multiplier 327 for multiplying the output of third unit delay 323 by a CSD coefficient coef_3, a first adder 328 for adding the outputs of first and second CSD multipliers 324 and 325, a second adder 329 for adding the outputs of third and fourth multipliers 326 and 327, a first inverse scaler 330 for scaling the output of first adder 328 with a first inverse-scaling factor (RSF_0), a second inverse scaler 331 for scaling the output of second adder 329 with a second inverse-scaling factor (RSF_1), and an adder 332 for adding the outputs of first and second inverse scalers 330 and 331 to output a final filter output.

Here, CSD coefficients coef_0 through coef_3 are those obtained by converting the first through fourth real coefficients produced according to the filter characteristics by means of the first and second scaling factors which are grouped according to characteristics of CSD coefficients, as described above. The first and second inverse-scaling factors are the reciprocals of the first and second scaling factors, respectively.

In an ideal embodiment of the present invention, shown in FIG. 5, a different RSF is involved in every coefficient calculation. Thus, the amount of hardware may be increased, whilst coefficient conversion is rapid and conversion performance is excellent because of the high resolution of scaling factors. Of course, if the calculation of the inverse-scaling factors is performed only by shifters when the scaling factors and the inverse scaling factors are expressed by powers of 2, there will be no increase in the amount of hardware. In this case, however, the available scaling factors and inverse-scaling factors are restricted somewhat.

Contrarily, in the embodiment shown in FIG. 8, the resolution of scaling factors is limited to a predetermined number. Thus, the amount of hardware is reduced, whilst the conversion performance is degraded.

That is, in the present invention, performance and hardware complexity are traded-off against one another due to the scaling factor resolution.

Further, when scaling with scaling factors or inverse-scaling factors is performed only by shifters, an increase in the amount of hardware is prevented even though conversion performance may be slightly restricted.

The present invention reduces conversion errors caused by differences between filter coefficients by using at least two scaling factors, whilst the conventional method uses a single scaling factor for all real coefficients. In addition, the present invention improves conversion performance by increasing scaling factor resolution while reference (3) reduces conversion errors with bit resolution.

As described above, the method according to the present invention improves the processing speed by converting a real coefficient into a CSD coefficient in the time domain instead of processing in the frequency domain. Further, the present invention can be applied to many types of filters such as an adaptive filter or a polyphase filter, by increasing bit resolution with a fixed number of non-zero digits.

What is claimed is:

1. A method for processing a signal in a canonic signed digit (CSD) filter having desired filter characteristics obtained based on filter coefficients expressed in CSD codes called CSD coefficients, the method comprising the steps of:
   (a) obtaining real coefficients optimized to the desired filter characteristics;
   (b) calculating scaling factors for the real coefficients which minimize an error during a conversion of the real coefficients into most approximate CSD coefficients;
   (c) converting said real coefficients into optimum CSD coefficients by using said scaling factors; and
   (d) filtering input data by using said optimum CSD coefficients.

2. The method for processing a signal in a CSD filter as claimed in claim 1, wherein in said step (b), said scaling factors are calculated so that the squared error sum between said real coefficients and corresponding CSD coefficients is minimized, wherein said most approximate CSD coefficients are obtained by multiplying said real coefficients by a predetermined gain.

3. The method for processing a signal in a CSD filter as claimed in claim 1, wherein in said step (c), said CSD coefficients are produced in the time domain by multiplying said real coefficients by said scaling factors calculated for said real coefficients.

4. The method for processing a signal in a CSD filter as claimed in claim 1, wherein said step (c) comprises the steps of:
   (c1) converting real coefficients into first CSD coefficients by multiplying scaling factors by respective real coefficients; and
   (c2) operating on said first CSD coefficients with an optimization algorithm based on an amount of ripple in the frequency domain to produce optimized second CSD coefficients.

5. A method for processing a signal in a canonic signed digit (CSD) filter having filter coefficients expressed in CSD codes which produce desired filter characteristics, the method comprising the steps of:
   (a) obtaining real coefficients optimized to said desired filter characteristics;
   (b) calculating a scaling factor for each real coefficient, which minimizes an error between said each real coefficient and a CSD code into which said each real coefficient is converted;
   (c) producing a CSD coefficient by using said scaling factor for said each real coefficient, wherein the CSD coefficients are CSD codes;
   (d) multiplying input data by each of said CSD coefficients; and
   (e) producing a final filter output by scaling the result of the multiplication in said step (d) by inverse-scaling factors which are the reciprocals of the scaling factors.

6. The method for processing a signal in a CSD filter, as claimed in claim 5, wherein in said step (b) the scaling factor for each real coefficient is calculated so that the squared error sum between said the real coefficients and the most approximate corresponding CSD coefficients obtained by multiplying each of said real coefficients by a predetermined gain is minimized.

7. A method for processing a signal in a canonic signed digit (CSD) filter having filter coefficients expressed in CSD codes which produce desired filter characteristics, the method comprising the steps of:
   (a) obtaining real coefficients optimized to said desired filter characteristics;
   (b) calculating a plurality of scaling factors which minimizes conversion errors between said real coefficients and most approximate CSD coefficients into which said real coefficients are converted, wherein said CSD coefficients are CSD codes;
   (c) producing optimum CSD coefficients by using said plurality of scaling factors; and
   (d) filtering input data by using said CSD coefficients.

8. The method for processing a signal as claimed in claim 7, wherein said step (b) comprises the steps of:
   (b1) grouping the real coefficients into a fewer number of groups according to characteristics of the CSD coefficients; and
   (b2) calculating scaling factors for each group of real coefficients of step (b1) which minimizes the squared error sum between the grouped real coefficients and the most approximate CSD coefficients obtained by multiplying said grouped real coefficients by a predetermined gain.

9. The method for processing a signal in a CSD filter, as claimed in claim 7, wherein said step (b) comprises the steps of:
   (b1') calculating a scaling factor for each of the real coefficients, which minimizes the error between said real coefficient and the most approximate CSD coefficient obtained by multiplying said real coefficients by a predetermined gain; and
   (b2') grouping said scaling factors for said real coefficients according to the values of said scaling factors, wherein said scaling factors having similar values are grouped together.

10. The method for processing a signal in a CSD filter as claimed in claim 7, wherein in said step (c), said CSD coefficients are produced in the time domain by multiplying said real coefficients by said plurality of scaling factors.

11. The method for processing a signal in a CSD filter as claimed in claim 7, wherein said step (c) comprises the steps of:

(c1) converting said real coefficients into first CSD coefficients by multiplying said real coefficients by said plurality of scaling factors; and (c2) producing optimized second CSD coefficients from said first CSD coefficients by using an optimization algorithm based on an amount of ripple in the frequency domain.

12. A method for processing a signal in a canonic signed digit (CSD) filter having filter coefficients expressed in CSD codes which produce desired filter characteristics, the method comprising the steps of:

(a) obtaining real coefficients optimized to said desired filter characteristics;

(b) calculating a plurality of scaling factors which minimize conversion errors between said real coefficients and CSD codes into which said real coefficients are converted;

(c) producing CSD coefficients by converting said real coefficients into CSD codes by using said plurality of scaling factors;

(d) multiplying input data by said CSD coefficients; and (e) producing a final filter output by scaling the result of the multiplication of said step (d) with a plurality of inverse-scaling factors which are the reciprocals of said plurality of scaling factors.

13. The method for processing a signal in a CSD filter as claimed in claim 12, wherein said step (b) comprises the steps of:

(b1) grouping real coefficients into a fewer number of groups according to characteristics of CSD coefficients; and (b2) calculating a scaling factor for each group of real coefficients from step (b1) which minimizes the squared error sum between said grouped real coefficients and most approximate CSD codes obtained by multiplying said grouped real coefficients by a predetermined gain.

14. The method for processing a signal in a CSD filter as claimed in claim 12, wherein said step (b) comprises the step of:

(b1') grouping said scaling factors in accordance with the values of said scaling factors, wherein said scaling factors are grouped based on similarity of the values of the scaling factors.

15. An N-tap canonic signed digit (CSD) filter circuit having real filter coefficients expressed in CSD codes producing desired filter characteristics, comprising:

N−1 unit delays connected in series for delaying input data;

a CSD coefficient generator for calculating scaling factors for the real coefficients which minimize an error between the real coefficients and most approximate CSD coefficients obtained by multiplying said real coefficients obtained according to said filter characteristics by a predetermined gain, and generating optimum CSD coefficients by using said calculated scaling factors;

N CSD multipliers for multiplying outputs of said N−1 unit delays by said optimum CSD coefficients;

N inverse scalers for scaling outputs of said N CSD multipliers with inverse-scaling factors which are the reciprocals of said scaling factors calculated for the real coefficients by said CSD coefficient generator; and an adder for adding outputs of said N inverse scalers and producing a final filter output.

16. The CSD filter circuit as claimed in claim 15, wherein each of said N CSD multipliers comprises:

L shift matrices for shifting said input data according to the value of each digit of the CSD coefficients generated by said CSD coefficient generator, wherein L is the number of non-zero digits in the CSD coefficients;

L converters for converting outputs of said L shift matrices into a 2's complements representation; and L−1 adders for adding outputs of said L converters.

17. The CSD filter circuit as claimed in claim 16, wherein if said CSD filter is an adaptive type filter, said shift matrix is comprised of a barrel shifter.

18. The CSD filter circuit as claimed in claim 16, wherein if said CSD filter is a fixed type filter, said shift matrix is comprised of hard-wiring which performs the shifting operation.

19. The CSD filter circuit as claimed in claim 16, wherein each of said L converters comprises an inverter and an adder for converting the output of a corresponding shift matrix into the 2's complements representation only when a digit of the CSD coefficient having a value corresponding to "−1" is received by the converter.

20. The CSD filter circuit as claimed in claim 15, wherein each of said N inverse scalers is comprised of shifters for shifting the output of a corresponding one of said N CSD multipliers according to a value of one of the inverse-scaling factors, and outputting the shifted result.

21. The CSD filter circuit as claimed in claim 15, wherein each of N inverse scalers is comprised of a CSD multiplier for multiplying the output of a corresponding one of said N CSD multipliers by one of the inverse-scaling factors.

22. The CSD filter circuit as claimed in claim 15, wherein said CSD coefficient generator includes:

a microprocessor for obtaining the real coefficients according to said desired filter characteristics, and calculating scaling factors for each of said real coefficients which minimize errors between said real coefficients and most approximate CSD coefficients obtained by multiplying said real coefficients by a predetermined gain; and a shifter for shifting said CSD coefficients and generating optimum CSD coefficients by using said scaling factors.

23. An N-tap canonic signed digit (CSD) filter circuit having real filter coefficients expressed in CSD codes which produce desired filter characteristics, comprising:

N−1 unit delays connected in series for delaying input data;

a CSD coefficient generator for generating CSD coefficients by using a plurality (M) of scaling factors which minimize errors between the real coefficients and most approximate CSD coefficients obtained by multiplying said real coefficients by a predetermined gain;

N CSD multipliers for multiplying outputs of said N−1 unit delays by the CSD coefficients generated according to the M scaling factors;

M adders for adding outputs of said N CSD multipliers;

M inverse scalers for scaling outputs of said M adders with M inverse-scaling factors which are the reciprocals of the M scaling factors; and an adder for adding outputs of said M inverse scalers and outputting a final filter output.

24. The CSD filter circuit as claimed in claim 23, wherein said CSD coefficient generator groups real coefficients into a fewer number of groups according to characteristics of the CSD coefficients, multiplies the grouped real coefficients by a predetermined gain, thereby obtaining the most approximate CSD coefficients, and calculates scaling factors for each group of real coefficients which minimize the sum of errors between said real coefficients and the CSD coefficients.

25. The CSD filter circuit as claimed in claim 23, wherein said CSD coefficient generator calculates a scaling factor for each real coefficient which minimizes the error between said real coefficient and a CSD coefficient obtained by multiplying said real coefficients by a predetermined gain, groups the scaling factors according to similarities in values of said scaling factors, and produces a plurality of scaling factors.

26. The CSD filter circuit as claimed in claim 23, wherein each of said N CSD multipliers comprises:

L shift matrices for shifting input data in accordance with the value of each digit of the CSD coefficients generated by said CSD coefficient generator, wherein L is the number of non-zero digits in the CSD coefficients;

L converters for converting the outputs of said L shift matrices into a 2's complement representation according to each of said CSD coefficients; and L−1 adders for adding outputs of said L converters.

27. The CSD filter circuit as claimed in claim 23, wherein each of said M inverse scalers is comprised of a shifter for shifting the output of each of said M adders according to a value of each of the M inverse-scaling factors, and outputting a shifted result.

28. The CSD filter circuit as claimed in claim 23, wherein each of said M inverse scalers comprises a CSD multiplier for multiplying the output of each of said M adders by one of said M inverse-scaling factors.

29. The CSD filter circuit as claimed in claim 23, wherein said CSD coefficient generator includes:

a microprocessor for obtaining the real coefficients according to said filter characteristics, multiplying said real coefficients by a predetermined gain, thereby obtaining the most approximate CSD coefficients, and calculating scaling factors for each real coefficient which minimizes errors between said real coefficients and said CSD coefficients; and a shifter for shifting said CSD coefficients and generating optimum CSD coefficients by using said scaling factors.

* * * * *